(12) United States Patent
Zhao et al.

(10) Patent No.: US 10,490,756 B2
(45) Date of Patent: Nov. 26, 2019

(54) METHOD FOR FABRICATING FLEXIBLE OLED PANEL AND FLEXIBLE OLED PANEL

(71) Applicant: WUHAN CHINA STAR OPTOELECTRONICS SEMICONDUCTOR DISPLAY TECHNOLOGY CO., LTD., Wuhan, Hubei (CN)

(72) Inventors: Yu Zhao, Guangdong (CN); Caiqin Chen, Guangdong (CN); Xing Ming, Guangdong (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/740,279

(22) PCT Filed: Nov. 24, 2017

(86) PCT No.: PCT/CN2017/112913
§ 371 (c)(1),
(2) Date: Dec. 27, 2017

(87) PCT Pub. No.: WO2019/085096
PCT Pub. Date: May 9, 2019

(65) Prior Publication Data
US 2019/0140195 A1    May 9, 2019

(30) Foreign Application Priority Data
Nov. 6, 2017 (CN) .......................... 2017 1 1077122

(51) Int. Cl.
*H01L 51/00*      (2006.01)
*H01L 51/56*      (2006.01)

(52) U.S. Cl.
CPC ...... *H01L 51/0096* (2013.01); *H01L 51/0016* (2013.01); *H01L 51/56* (2013.01); *H01L 2251/5338* (2013.01)

(58) Field of Classification Search
CPC . H01L 51/0096; H01L 51/0016; H01L 51/56; H01L 2251/5338; H01L 29/78645
See application file for complete search history.

(56) References Cited

U.S. PATENT DOCUMENTS 9,263,507 B2    2/2016 Lee et al.
2006/0255338 A1    11/2006 Jeong et al.
(Continued)

FOREIGN PATENT DOCUMENTS

CN    101047199 A    10/2007
CN    103311455 A    9/2013
(Continued)

*Primary Examiner* — Mohammed R Alam
(74) *Attorney, Agent, or Firm* — Hemisphere Law, PLLC; Zhigang Ma

(57) ABSTRACT

A method for fabricating a flexible OLED panel comprises the following steps. A rigid substrate is provided. A flexible basal layer is formed on the rigid substrate. A buffer layer, a semiconductor layer and a first gate insulating layer are formed one by one on the rigid substrate. A channel doping is performed. A first gate is formed on the first gate insulating layer. A source and drain doping is performed. An activating treatment is performed and then a second gate insulating layer is formed on the first gate. A hydrogen treatment is performed and then a second gate, an organic insulating layer, a source and a drain, a planar layer and an OLED structure are formed one by one on the second gate insulating layer. A laser lift-off procedure is applied to separate the rigid substrate and the flexible basal layer for getting a flexible OLED panel.

7 Claims, 4 Drawing Sheets

(56) References Cited

U.S. PATENT DOCUMENTS

| | | | | |
|---|---|---|---|---|
| 2015/0090980 A1* | 4/2015 | Lee | ................... | H01L 27/3262 257/40 |
| 2015/0228799 A1* | 8/2015 | Koezuka | ............... | H01L 27/124 257/43 |

FOREIGN PATENT DOCUMENTS

| | | |
|---|---|---|
| CN | 104681628 | 6/2015 |
| CN | 107017287 | 8/2017 |
| CN | 107134474 A | 9/2017 |

* cited by examiner

METHOD FOR FABRICATING FLEXIBLE OLED PANEL AND FLEXIBLE OLED PANEL

RELATED APPLICATIONS

The present application is a National Phase of International Application Number PCT/CN2017/1112913, filed Nov. 24, 2017, and claims the priority of China Application No. 201711077122.0, filed Nov. 6, 2017.

FIELD OF THE DISCLOSURE

The disclosure relates to a display technical field, and more particularly to a method for fabricating a flexible OLED panel and a flexible OLED panel.

BACKGROUND

The organic light emitting displays (OLED) with the excellent display performances of spontaneous luminescence, wide viewing angles, lower power consumption, fast response, realizing the flexible displays, etc., have been widely used as the display panels in many electrical products, such as mobile phone, TV and computer.

The current OLED display panels include OLED devices and thin film transistors (TFT) array substrate, and in the fabricating process thereof, it is required to perform the channel doping and the source/drain doping. In the doping procedures, the polysilicon usually is damaged, so it is necessary to perform an activating treatment for fixing the polysilicon. Besides, the boundary between the polysilicon layer and the gate oxide layer has nonbonding orbital of dangling bonds, thereby to cause the density of the polysilicon boundary to increase. It is required to passivate the defects on the boundary of and inside the polysilicon layer by applying the hydrogen treatment. Currently, the activating treatment includes high-temperature furnace annealing, laser activation method, etc., all required to be performed at high temperature. Because the insulating layers include an inorganic insulating layer and an organic insulating layer, the thickness thereof is larger. It is easy to occur peeling due to the excessive stress caused by thermal expansion at high temperature. The hydrogen must penetrate through multiple films to enter the polysilicon layer in the hydrogen treatment, so the diffusing distance of hydrogen is very long. For hydrogenating fully, it is necessary to heat the device with a long time, thereby to cause cracks appearing on the insulating layer and increase power consumption and product cost of the OLED display panels.

SUMMARY

Accordingly, the present invention provides a method for fabricating a flexible OLED panel. By shifting the activating and the hydrogen treatments to earlier stages in the conventional process for fabricating the flexible OLED panels and omitting the procedure to form an inorganic insulating layer of the insulating layers, the quantity of the insulating layers is guaranteed, the thickness of flexible OLED panels is decreased, the production process is shortened, the manufacturing cost is reduced, the electrical performance and reliability are promoted, and other performances of the original flexible OLED panels are maintained at the same time. The present invention also provides the flexible OLED panel fabricated by above method.

In a first respect, a method for fabricating a flexible OLED panel provided by the present invention comprises the steps of providing a rigid substrate and forming a flexible basal layer on the rigid substrate; forming a buffer layer, a semiconductor layer and a first gate insulating layer one by one on the rigid substrate, and performing a channel doping; forming a first gate on the first gate insulating layer, and performing a source and drain doping; performing an activating treatment, and then forming a second gate insulating layer on the first gate; performing a hydrogen treatment, and then forming a second gate, an organic insulating layer, a source and a drain, a planar layer and an OLED structure one by one on the second gate insulating layer; and applying a laser lift-off procedure to separate the rigid substrate and the flexible basal layer for getting a flexible OLED panel.

Optionally, the activating treatment is annealing about 10 to 120 minutes at 400° C. to 600° C.

Further optionally, the activating treatment is performed at 450° C. about 60 minutes.

Optionally, the hydrogen treatment is performed by applying a plasma hydrogenation process, a solid-state diffusion process or a hydrogen ion implantation process.

Optionally, the hydrogen treatment is performed at 250° C. to 450° C. about 0.5 to 4 hours.

Optionally, the material of the organic insulating layer includes one or more of a combination of polyimide, polystyrene, teflon and silicone silsesquioxane resin.

Optionally, the thickness of the organic insulating layer is 0.8 μm to 1.2 μm.

Optionally, the material of the first gate insulating layer is one or more of a combination of silicon nitride, silicon oxide and silicon oxynitride, and the material of the second gate insulating layer includes silicon nitride.

Optionally, the materials of the first gate and the second gate include one or more of a combination of molybdenum, aluminum, copper and titanium.

In a second respect, the present invention provides a flexible OLED panel fabricated by the method for fabricating the flexible OLED panel depicted in the first respect. The flexible OLED panel, comprises: a flexible basal layer; a buffer layer, a semiconductor layer, a first gate insulating layer, a first gate, a second gate insulating layer, a second gate, an organic insulating layer, a source and a drain, a planar layer and an OLED structure formed on the flexible basal layer one by one; wherein a part of the organic insulating layer covers a surface of the second gate and another part of the organic insulating layer covers a surface of the second gate insulating layer, and the planar layer covers a surface of the organic insulating layer and covers the source and the drain completely.

The present invention has following advantages. The present invention provides a method for fabricating a flexible OLED panel and a flexible OLED panel. By shifting the activating and the hydrogen treatments to earlier stages in the conventional process for fabricating the flexible OLED panels and omitting the procedure to form an inorganic insulating layer of the insulating layers, the quantity of the insulating layers is guaranteed, the thickness of flexible OLED panels is decreased, the production process is shortened, the manufacturing cost is reduced, the electrical performance and reliability are promoted, and other performances of the original flexible OLED panels are maintained at the same time.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

The specific structural and functional details disclosed herein are only representative and are intended for describing exemplary embodiments of the disclosure. However, the disclosure can be embodied in many forms of substitution, and should not be interpreted as merely limited to the embodiments described herein.

Figure 1:
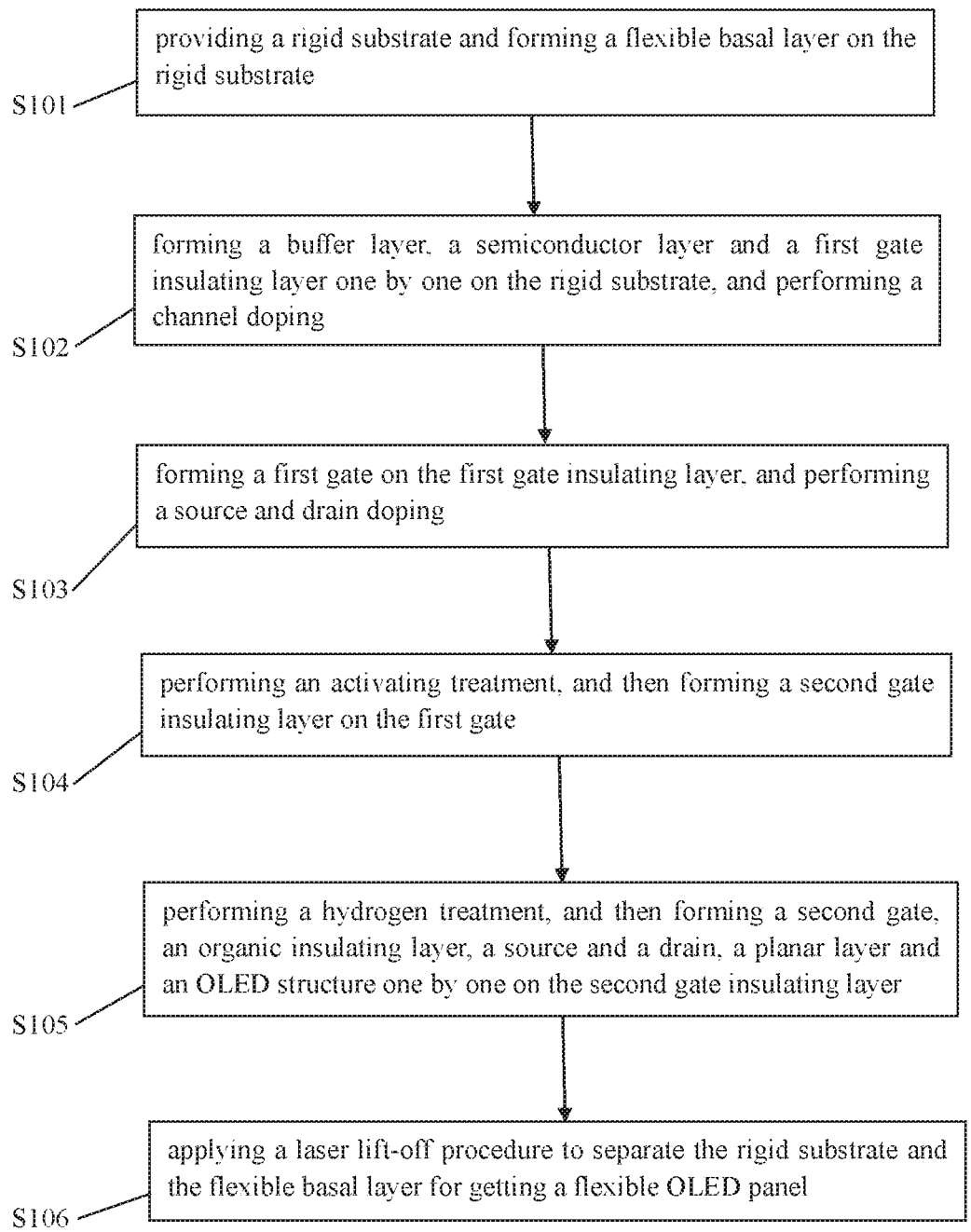
FIG. 1 is a flow chart illustrating the method for fabricating a flexible OLED panel provided in one embodiment of the present invention.

Referring to FIG. 1, the flow chart of the method for fabricating a flexible OLED panel in one embodiment provided by the present invention is illustrated. The method comprises the following steps.

Step S101 is providing a rigid substrate and forming a flexible basal layer on the rigid substrate.

Figure 2:
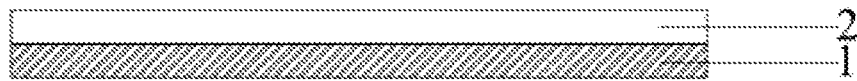
FIG. 2 is a cross-sectional view of a rigid substrate illustrating the step S101 of the method for fabricating a flexible OLED panel provided in one embodiment of the present invention.

Referring to FIG. 2, a rigid substrate 1 is provided. The rigid substrate 1 can be a glass substrate, a quartz substrate, etc. After the rigid substrate 1 is cleaned by a dry cleaning or a wet cleaning, a flexible basal layer 2 is formed on the rigid substrate 1 to cover the rigid substrate 1 completely.

Step S102 is forming a buffer layer, a semiconductor layer and a first gate insulating layer one by one on the rigid substrate, and performing a channel doping.

Figure 3:
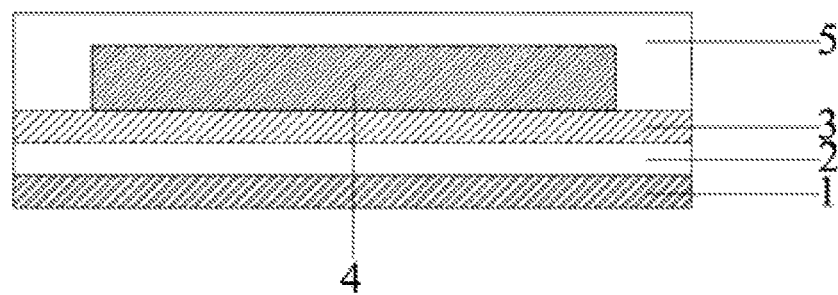
FIG. 3 is a cross-sectional view of a rigid substrate illustrating the step S102 of the method for fabricating a flexible OLED panel provided in one embodiment of the present invention.

Referring to FIG. 3, by applying the coating process, such as plasma-enhanced chemical vapor deposition (PECVD), a buffer layer 3 is formed on the flexible basal layer 2 to cover the flexible basal layer 2 completely. Optionally, between the flexible basal layer 2 and the buffer layer 3 can be formed a buffer layer and a flexible basal layer one by one. By applying the coating process, such as PECVD, an amorphous silicon film is deposited on the buffer layer 3. The amorphous silicon film covers a part of the buffer layer 3. A crystallization treatment is performed to the amorphous silicon film for transforming the amorphous silicon to a polysilicon film. The polysilicon film is then patterned to get the semiconductor layer 4. In specific, by applying the excimer laser crystallization process, the amorphous silicon film would transform to the polysilicon film. Then, the polysilicon film is defined with pattern to form the semiconductor layer 4. A coating process is performed to deposit the first gate insulating layer 5 on the semiconductor layer 4. Optionally, the first gate insulating layer 5 covers the semiconductor layer 4 completely and the area of the buffer layer 3 not covered by the semiconductor layer 4. Optionally, the material of the first gate insulating layer 5 is one or more of a combination of silicon nitride, silicon oxide and silicon oxynitride. A channel doping is performed by P-type doping or N-type doping the semiconductor layer 4 to form the corresponding P-type semiconductor or N-type semiconductor. In specific, the ions of P-type doping are boron ions, and the ions of N-type doping are phosphorus ions.

Step S103 is forming a first gate on the first gate insulating layer, and performing a source and drain doping.

Figure 4:
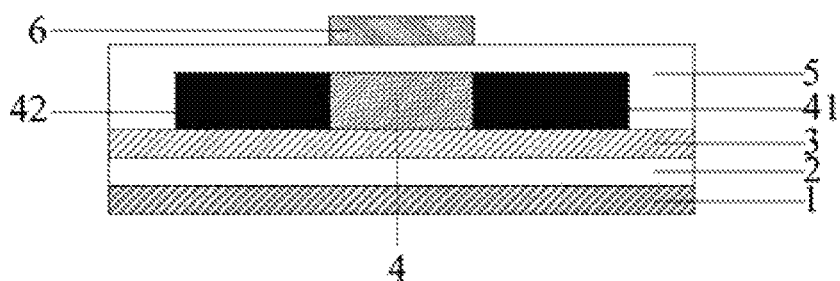
FIG. 4 is a cross-sectional view of a rigid substrate illustrating the step S103 of the method for fabricating a flexible OLED panel provided in one embodiment of the present invention.

Referring to FIG. 4, a physical vapor deposition procedure is performed to form a first gate 6 on the first gate insulating layer 5 to cover a part of the first gate insulating layer 5. Optionally, the material of the first gate 6 includes one or more of a combination of molybdenum (Mo), aluminum (Al), copper (Cu) and titanium (Ti). In specific, a gate metal layer is deposited on the first gate insulating layer 5, and then is patterned to form the first gate 6. N-type heavy doping or P-type heavy doping is performed to two sides of the semiconductor layer 4, for forming the corresponding N-type semiconductor or P-type semiconductor. The heavy doping area 41 and the heavy doping area 42 are formed on two sides of the semiconductor layer 4. The ions of N-type heavy doping are phosphorus ions, and the ions of P-type heavy doping are boron ions.

Step S104 is performing an activating treatment, and then forming a second gate insulating layer on the first gate.

Figure 5:
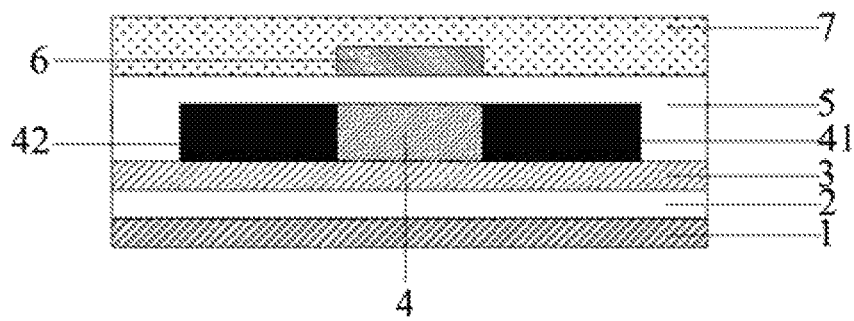
FIG. 5 is a cross-sectional view of a rigid substrate illustrating the step S104 of the method for fabricating a flexible OLED panel provided in one embodiment of the present invention.

Referring to FIG. 5S, the activating treatment includes high-temperature furnace annealing, laser activation method, etc., for fixing the damaged polysilicon lattices of the semiconductor layer 4. The activating treatment is annealing about 10 to 120 minutes at 400° C. to 600° C. Optionally, the activating treatment is performed at 450° C. about 60 minutes. The second gate insulating layer 7 is formed on the first gate 6. The second gate insulating layer 7 covers the first gate 6 completely and covers the area of the first gate insulating layer 5 not covered by the first gate 6. The material of the second gate insulating layer 7 includes silicon nitride (SiNx), to supply hydrogen for the channel in the later hydrogen treatment.

Step S105 is performing a hydrogen treatment, and then forming a second gate, an organic insulating layer, a source and a drain, a planar layer and an OLED structure one by one on the second gate insulating layer.

Figure 6:
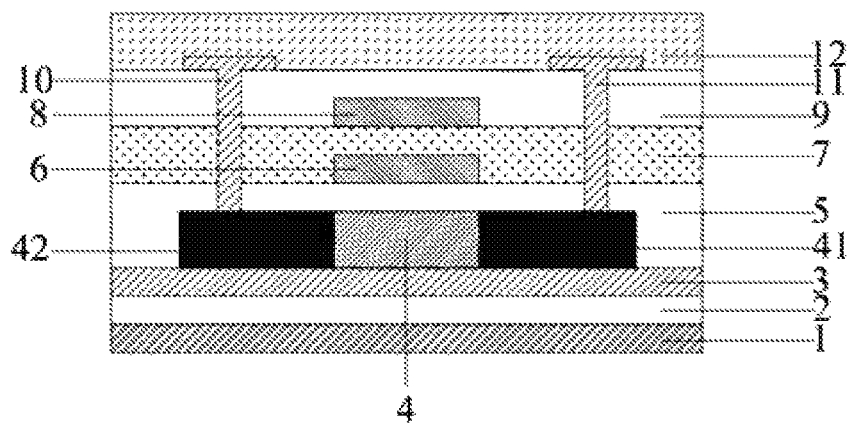
FIG. 6 is a cross-sectional view of a rigid substrate illustrating the step S105 of the method for fabricating a flexible OLED panel provided in one embodiment of the present invention.

Referring to FIG. 6, the hydrogen treatment includes a plasma hydrogenation process, a solid-state diffusion process, a hydrogen ion implantation process, etc. In the environment full of hydrogen ions or activating hydrogen atoms, the hydrogen would diffuse to the semiconductor layer and combine with the defects therein to form saturated bonds, thereby to passivate the dangling bonds in boundaries of polysilicon grains. Optionally, the hydrogen treatment is performed at 250° C. to 450° C. about 0.5 to 4 hours. A physical vapor deposition procedure is performed to form a second gate 8 on the second gate insulating layer 7 to cover a part of the second gate insulating layer 7. Optionally, the material of the second gate 8 includes one or more of a combination of molybdenum (Mo), aluminum (Al), copper (Cu) and titanium (Ti). In specific, a gate metal layer is deposited on the second gate insulating layer 7, and then is patterned to form the second gate 8. An organic insulating layer 9 is formed on the second gate 8. The material of the organic insulating layer includes one or more of a combination of polyimide, polystyrene, teflon and silicone silsesquioxane resin. Optionally, the thickness of the organic insulating layer 9 is 0.8 µm to 1.2 µm. Further optionally, the thickness of the organic insulating layer 9 is 1.0 µm. A source 10 and a drain 11 are formed on the heavy doping area 42 and the heavy doping area 41, and then a planar layer 12 and an OLED structure on the planar layer 12 are formed. The planar layer 12 covers a surface of the organic insulating layer 9 and covers the source 10 and the drain 11 completely. The OLED structure is not shown in figures.

Step S106 is applying a laser lift-off procedure to separate the rigid substrate and the flexible basal layer for getting a flexible OLED panel.

Figure 7:
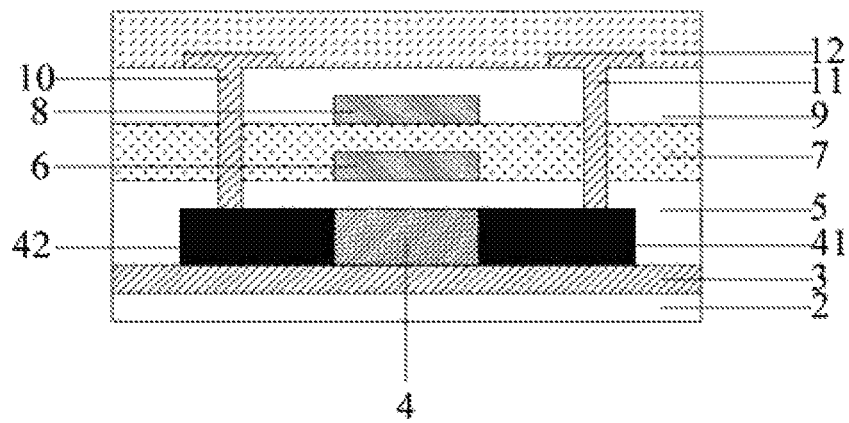
FIG. 7 is a cross-sectional view of a flexible OLED panel illustrating the step S106 of the method for fabricating a flexible OLED panel provided in one embodiment of the present invention.

The laser lift-off procedure is used to separate the rigid substrate 1 and the flexible basal layer 2 for getting the flexible OLED panel, as shown in FIG. 7.

In the method for fabricating the flexible OLED panel provided in the embodiment of the present invention, the activating treatment of the conventional method for fabricating the flexible OLED panel is shifted to an earlier stage after the source and drain doping procedure is performed, and the hydrogen treatment is performed after the second gate insulating layer is formed, thereby to decrease the number of films to be baked at high temperature in the activating treatment and decrease the number of films the hydrogen has to diffuse through in the hydrogen treatment, for ensuring the hydrogen can enter the semiconductor as soon as possible, shortening the diffusing distances, saving the hydrogenation time. At the same time, because the second gate insulating layer can be applied to replace the inorganic insulating layer for supplying hydrogen in the hydrogen treatment, the procedure to form the inorganic insulating layer of the insulating layers is omitted, and only the organic insulating layer is formed to serve as the insulating layers. Therefore, the thickness of flexible OLED panel is decreased, the production process is shortened, the electrical performance and reliability are promoted, and other performances of the original flexible OLED panels are maintained at the same time.

Figure 8:
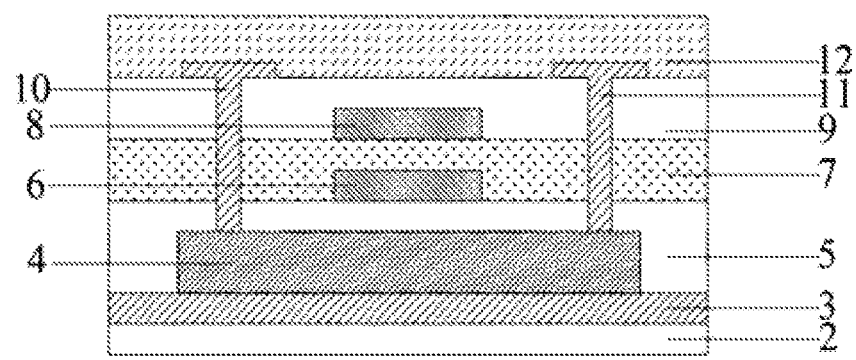
FIG. 8 is a cross-sectional view of a flexible OLED panel provided in one embodiment of the present invention.

The present invention also provides a flexible OLED panel. The flexible OLED panel is fabricated by the above method for fabricating the flexible OLED panel. As shown in FIG. 8, the flexible OLED panel comprises a flexible basal layer 2, and a buffer layer 3, a semiconductor layer 4, a first gate insulating layer 5, a first gate 6, a second gate insulating layer 7, a second gate 8, an organic insulating layer 9, a source 10, a drain 11, a planar layer 12 and an OLED structure formed on the flexible basal layer 2 one by one. The OLED structure is not shown in figures. A part of the organic insulating layer 9 covers a surface of the second gate 8 and another part of the organic insulating layer 9 covers a surface of the second gate insulating layer 7, and the planar layer 12 covers a surface of the organic insulating layer 9 and covers the source 10 and the drain 11 completely.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:

1. A method for fabricating a flexible OLED panel, comprising:
   providing a rigid substrate and forming a flexible basal layer on the rigid substrate;
   forming a buffer layer, a semiconductor layer and a first gate insulating layer one by one on the rigid substrate, and forming a channel region by doping the semiconductor layer;
   forming a first gate on the first gate insulating layer, and forming a source region and drain region by doping the semiconductor layer;
   performing an activating treatment on the semiconductor layer, and then forming a second gate insulating layer on the first gate;
   performing a hydrogen treatment on the second gate insulting layer, and then forming a second gate, an organic insulating layer, a source electrode and a drain electrode, a planar layer and an OLED structure one by one on the second gate insulating layer; and
   applying a laser lift-off procedure to separate the rigid substrate and the flexible basal layer for getting a flexible OLED panel;
   wherein the activating treatment is annealing 10 to 120 minutes at 400° C. to 600° C., and the hydrogen treatment is performed by applying a plasma hydrogenation process, a solid-state diffusion process or a hydrogen ion implantation process.

2. The method for fabricating a flexible OLED panel according to claim 1, wherein the activating treatment is performed at 450° C. about 60 minutes.

3. The method for fabricating a flexible OLED panel according to claim 1, wherein the hydrogen treatment is performed at 250° C. to 450° C. about 0.5 to 4 hours.

4. The method for fabricating a flexible OLED panel according to claim 1, wherein a material of the organic insulating layer includes one or more of a combination of polyimide, polystyrene, teflon and silicone silsesquioxane resin.

5. The method for fabricating a flexible OLED panel according to claim 1, wherein a thickness of the organic insulating layer is 0.8 µm to 1.2 µm.

6. The method for fabricating a flexible OLED panel according to claim 1, wherein a material of the first gate insulating layer is one or more of a combination of silicon nitride, silicon oxide and silicon oxynitride, and a material of the second gate insulating layer includes silicon nitride.

7. The method for fabricating a flexible OLED panel according to claim 1, wherein materials of the first gate and the second gate include one or more of a combination of molybdenum, aluminum, copper and titanium.

* * * * *